US011806677B2

(12) United States Patent
Tarutani et al.

(10) Patent No.: US 11,806,677 B2
(45) Date of Patent: Nov. 7, 2023

(54) PREPROCESSING METHOD FOR SOLID MATERIAL, AND SOLID MATERIAL PRODUCT FILLED WITH SOLID MATERIAL MANUFACTURED USING SAID SOLID MATERIAL PREPROCESSING METHOD

(71) Applicants: L'Air Liquide, Société Anonyme pour l'Etude et l'Exploitation des Procédés Georges Claude, Paris (FR); American Air Liquide, Inc., Fremont, CA (US)

(72) Inventors: Kohei Tarutani, Tsukuba (JP); Jean-Marc Girard, Versailles (FR); Nicolas Blasco, Grenoble (FR); Stefan Wiese, San Jose, CA (US); Guillaume Husson, Newark, DE (US)

(73) Assignees: L'Air Liquide, Societe Anonyme Pour L'Etude Et L'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 726 days.

(21) Appl. No.: 16/772,234

(22) PCT Filed: Dec. 6, 2018

(86) PCT No.: PCT/EP2018/083863
§ 371 (c)(1),
(2) Date: Jun. 12, 2020

(87) PCT Pub. No.: WO2019/115361
PCT Pub. Date: Jun. 20, 2019

(65) Prior Publication Data
US 2021/0101089 A1    Apr. 8, 2021

(30) Foreign Application Priority Data

Dec. 14, 2017  (JP) ................. 2017-239342

(51) Int. Cl.
*B01D 7/02* (2006.01)
*C01G 41/04* (2006.01)

(52) U.S. Cl.
CPC ............... *B01D 7/02* (2013.01); *C01G 41/04* (2013.01); *C01P 2002/72* (2013.01); *C01P 2006/80* (2013.01)

(58) Field of Classification Search
CPC .................................. B01D 7/02; C01G 1/04
See application file for complete search history.

(56) References Cited

U.S. PATENT DOCUMENTS 4,490,512 A    12/1984  Katz
6,270,839 B1    8/2001  Onoe et al.
(Continued)

FOREIGN PATENT DOCUMENTS

EP    3 081 667    10/2016
GB       804 686    11/1958
(Continued)

OTHER PUBLICATIONS

International Search Report and Written Opinion for corresponding PCT/EP2018/083863, dated Mar. 6, 2019.

*Primary Examiner* — James A Fiorito
(74) *Attorney, Agent, or Firm* — Yan Jiang

(57) ABSTRACT

A preprocessing method comprises a sintering step of heating a solid material container filled with a solid material using a temperature which is lower than either the melting point or sublimation of the solid material, whichever is lower, and crystallizing at least part of the solid material, and an impurity removal step of heating the solid material container filled with the solid material using a temperature which is lower than either the melting point or sublimation of the solid material, whichever is lower, and removing at least part of the impurities included in the solid material.

4 Claims, 3 Drawing Sheets

(56) References Cited

U.S. PATENT DOCUMENTS

2017/0137936 A1  5/2017  Birtcher et al.
2019/0031526 A1  1/2019  Takahashi et al.

FOREIGN PATENT DOCUMENTS

| JP | 3 303391 | 7/2002 |
| JP | 2011 202199 | 10/2011 |
| JP | 2016 204755 | 12/2016 |
| WO | WO 2017 130745 | 8/2017 |

PREPROCESSING METHOD FOR SOLID MATERIAL, AND SOLID MATERIAL PRODUCT FILLED WITH SOLID MATERIAL MANUFACTURED USING SAID SOLID MATERIAL PREPROCESSING METHOD

CROSS REFERENCE TO RELATED APPLICATIONS

This application is a 371 of International Application No. PCT/EP2018/083863, filed Dec. 6, 2018, which claims priority to Japanese Patent Application No. 2017-239342, filed Dec. 14, 2017, the entire contents of which are incorporated herein by reference.

BACKGROUND

The present invention relates to a preprocessing method for providing a solid material from which impurities have been removed, and solid material product filled with the solid material manufactured using the solid material preprocessing method.

As the semiconductor industry has advanced, there has been a demand for use of high-purity precursor materials which might satisfy strict film requirements. These precursor materials are known in a broad range of uses for depositing semiconductor layers. Examples in semiconductor layers include the constituent components for barrier layers, high-dielectric-constant/low-dielectric-constant insulation layers, metal electrode layers, connection layers, ferroelectric layers, silicon nitride layers or silicon oxide layers, and the constituent components which act as dopants for compound semiconductors.

Some of these precursor materials are in the form of solids at standard temperatures and pressures. Exemplary precursor materials include inorganic compounds and organic metal compounds of aluminium, barium, bismuth, chrome, cobalt, copper, gold, hafnium, indium, iridium, iron, lanthanum, lead, magnesium, molybdenum, nickel, niobium, platinum, ruthenium, silver, strontium, tantalum, titanium, tungsten, yttrium, and zirconium.

Solid precursor materials are generally refined and purified using sublimation or recrystallization.

Patent Literature 1 provides a method for refining by heating a solid material to or past its boiling point to make it into a gas, removing impurities from the gaseous state, and condensing the solid material.

PRIOR ART LITERATURE

Patent Literature

Patent Literature 1: JP 2016-204755 A

However, the process of refinement using sublimation or recrystallization is ordinarily done in an off-site solid material manufacturing step away from the use point of the solid material. Accordingly, after the refinement process is complete, the solid material is put into solid material containers to be used at the use point and used. Therefore, not only is transferring the solid material to the solid material containers laborious, but there is the risk of impurities becoming mixed in during transfer.

For example, patent literature 1 discloses a method for heating tungsten hexachloride ($WCl_6$), which is a solid material to or past its boiling point (to or above 300° C.) to gasify it, and then condensing the $WCl_6$, thereby removing impurities such as $WOCl_4$ contained in the $WCl_6$. However, complex equipment is needed for this method, including a boiler for heating and a condenser for condensing the $WCl_6$. Moreover, in order to use the $WCl_6$ obtained by refinement for deposition of a semiconductor layer, the $WCl_6$ which has been condensed inside the condenser has to be transferred to a separate container (namely, a semiconductor layer deposition precursor supply container). This not only complicates the process of supplying the precursor, but also risks contaminating the precursor during transfer.

On this background, there has been a desire for development of a simple method for preprocessing solid materials capable of supplying the vapour of the solid material from which impurities have been removed.

SUMMARY

Invention 1

A method for preprocessing a solid material according to the present invention comprises an impurity removal step in which a solid material which fills a solid material container is heated at a temperature lower than the melting point of the solid material, and at least part of the impurities contained in the solid material are removed.

The external size of the solid material container has a length of 0.2 to 1.6 m, a width of 0.2 to 1.6 m, and a height no greater than 0.2 to 1.6 m if it is cubically shaped, for example. If it is round, the external size has a diameter of 0.2 to 1.6 m and a height of 0.2 to 1.6 m, for example. The volume capable of containing the solid material is 4 or less, 2 $m^3$ or less, 0.5 $m^3$ or less, or 0.1 $m^3$ or less, for example. Because the container is small, it is possible to heat the solid material using a heating mechanism which is smaller than conventional.

The solid material may be a precursor used in depositing a semiconductor layer. The solid material may be the precursor itself, or the solid material carried on a carrier body such as beads, etc. The solid material may be in a solid state when being filled, it may be a solid material when the solid material container is being transported, and it may be in a liquid state when being filled or when being heated after being filled. There is no particular limitation on the solid material, which may be a material including a compound selected from the group consisting of an organic compound, an organic metal compound, a metal halide, and mixtures of these. For example, it may be $WCl_5$, $WCl_6$, $WOCl_4$, $WO_2Cl_2$, $SiI_4$, $TiI_4$, $GeI_4$, $GeI_2$, $TiBr_4$, $Si_2I_6$, $BI_3$, $PI_3$, $TiF_4$, $TaF_5$, $MOO_2Cl_2$, $MOOCl_4$, $ZrCl_4$, $NbCl_5$, $NbOCl_3$, $TaCl_5$, $VCl_5$, $Y(CH_3C_5H_4)_3$, $Sc(CH_3C_5H_4)_3$, $MoCl_5$, $AlCl_3$, $HfCl_4$, $(CH_3)_3In$, $(C_5H_5)_2Mg$, $NbF_5$, $XeF_2$, $VF_5$ or carboxylic acid anhydride.

In this specification, impurities include oxides and halides of the solid material, metal impurities, moisture, and combinations thereof.

With the preprocessing method for a solid material according to the present invention, impurities can be removed without the solid material passing through phase changes including gasification (sublimation from a solid phase to a gas phase, or a phase change from a solid phase to a liquid phase and from a liquid phase to a gas phase) or recondensation (a phase change from a gas phase to a solid phase or a liquid phase). Accordingly, boilers for gasifying the entire solid material or recondensation or cooling devices for recondensing are not needed. All that is needed is a heating mechanism capable of heating the solid material to a temperature below the melting point of the solid material.

By heating the solid material container using this heating mechanism, the solid material filling the solid material container and impurities contained in the solid material are heated. At least some of the impurities contained in the solid material are thereby gasified. The gasified impurities are removed out of the solid material container, leaving only highly purified solid material in the solid material container.

If the solid material is liquefied and then resolidified, the impurities mixed in the solid material become difficult to gasify, causing their removal to become difficult. With the preprocessing method according to the present invention, the solid material is heated at a temperature lower than the melting point, and therefore the impurities can easily be removed without liquefaction and resolidification.

Of the impurities in the solid material, oxides are often formed on surfaces of granules of the solid material as a natural oxide film. The natural oxide film formed on the surface of granules of the solid material is thought to have the effect of preventing movement of the solid material between granules of the solid material, and therefore a focus of the present invention is that removing this natural oxide film is effective. Accordingly, in the present invention a method was arrived at wherein the natural oxide film is removed by heating the solid material and passing a carrier gas therethrough. The surfaces of granules of the solid material are easier to heat than the interior of the solid material, and therefore it is easy to remove impurities, which are oxides on the surface of the solid material.

For example, if the solid material is tungsten chloride, tungsten oxide, which is a natural oxide film, forms on the surface of the granules of the tungsten chloride, and with the present invention it is possible to remove this tungsten oxide.

If the solid material is iodide, free iodine, hydrogen iodide, or hydrides which are an impurity are often present on the surface of the solid material With the present invention, it is possible to remove these impurities. There is no particular limitation on the hydrides if they are a hydrogenated part of the solid material; examples include $SiHI_3$, $SiH_2I_2$, and $SiH_3I$ when the solid material is $SiI_4$.

The solid material processed by the preprocessing method according to the present invention is suitably used in semiconductor processes for depositing semiconductor layers. A uniform semiconductor layer of high purity can be deposited by purifying the solid material.

Invention 2

The impurity removal step of the preprocessing method according to the present invention may be a step of heating the solid material to a temperature less than the phase transition point thereof. The heating time in the impurity removal step depends on the size of the container, and the contained size of the solid material.

The solid material has different phase states (also called crystal states) depending on the temperature, and also has different vapour pressures according to the particular phase state. When the solid material is heated to a temperature at or above its phase transition point in the preprocessing stage, the solid material crystallizes, but when the solid material is placed in a temperature at or below the phase transition point during the semiconductor layer deposition layer thereafter, part of the solid material uncrystallizes. Therefore, there is a mix of crystallized and non-crystallized parts in the solid material, and the ratio of one to the other changes over time. As a result, the vapour pressure of the solid material becomes unstable, which in turn causes inconsistencies in the semiconductor layer that is deposited.

If the solid material has a crystal states which differ by temperature, e.g., one crystal state at a low temperature (henceforth referred to as a low-temperature phase) and another crystal state at a high temperature (henceforth referred to a high-temperature phase), the vapour pressure of the solid material in the low-temperature phase and the high-temperature phase differs. If the preprocessing is carried out at a temperature lower than the phase transition temperature at which the phase transition from the low-temperature phase to the high-temperature phase takes place, the solid material is in the low-temperature phase state. If the semiconductor layer deposition step which is carried out after the preprocessing is done at a temperature lower than the phase transition point, the low-temperature phase can be maintained, and fluctuation of the vapour pressure caused by the high-temperature phase can be minimized. As a result, a consistent semiconductor layer can be deposited.

With this configuration, the entire solid material can be maintained in an uncrystallized state by heating it to or below the phase transition point of the solid material. If the semiconductor layer deposition step is carried out at a temperature below the phase transition point, the solid material is kept in an uncrystallized state during the deposition step, and the vapour pressure of the solid material can be kept stable during the deposition step. As a result, a consistent semiconductor layer can be deposited.

The heating temperature during the impurity removal step need only be a temperature lower than the phase transition point of the solid material. If it is a temperature less than the phase transition point, the phase transition speed is faster the higher the temperature, which is preferable.

For example, it is known that $WCl_6$ has different crystal forms (a hexagonal form (also known as a beta form) which is the high-temperature phase and a trigonal form (also known as an alpha form) which is the low-temperature phase)), and that the vapour pressure differs depending on the crystal form. In the case of $WCl_6$ which has a phase transition point of 176° C., the temperature range of 126° C. to 175° C., inclusive, is preferable, and from 166° C. to 175°, inclusive, is more preferable. In the case of $WCl_5$ which has a phase transition point of 180° C., the temperature range of 130° C. to 179° C., inclusive, is preferable, and from 170° C. to 179°, inclusive, is more preferable.

In the case of $TiI_4$ which has a phase transition point of 106° C., the temperature range of 56° C. to 105° C., inclusive, is preferable, and from 96° C. to 105° C., inclusive, is more preferable.

A higher heating temperature during the crystallization step and the impurity removal step results in faster crystal transition speeds, so temperatures 1° C. to 50° C. below the phase transition point of the solid material are preferable, and temperatures 1° C. to 10° C. below are more preferable.

Invention 3

The preprocessing method according to the present invention can further comprise a sintering step of heating the solid material which fills a solid material container at a temperature less than a phase transition point of the solid material, and sintering at least part or all of the solid material.

The sintering step may be carried out concurrently or partly overlapping with the processing timing of the impurity removal step, or after the impurity removal step.

After the impurities (oxides) on the granule surfaces of the solid material are removed, sinter begins or is promoted by parts of the granules of the solid material having low impurity content come together and self-diffuse, which can make the crystal state even more uniform, which is preferable.

With the present invention, it is possible to sinter the solid material after impurities are removed during the impurity removal step, or together with removal of the impurities during the impurity removal step. If, during the impurity removal step, impurities such as oxides, etc., on surfaces of the particular solid material are removed, parts of the interiors of the granules of the solid material having low impurity content come together, further promoting sintering through self-diffusion, which can make the crystal state even more uniform.

The heating time in the impurity removal step depends on the size of the container, the contained size of the solid material, and the weight of the solid material.

Invention 4

In the impurity removal step of the preprocessing method according to the present invention, a carrier gas having a predetermined flow rate is introduced into the solid material container. The carrier gas may be introduced into the solid material container during the sintering step.

The impurity removal step may be carried out while the carrier gas is being introduced into the solid material container at a predetermined flow rate. The introduced carrier gas may be emitted through an emission pathway during the removal step, or after the removal step is finished.

As another embodiment, the carrier gas may be introduced into the solid material container after a predetermined amount of time has elapsed from the start of the impurity removal step. The gasified impurities are discharged from the container, accompanied by the carrier gas.

The sintering step may be carried out while introducing the carrier gas into the solid material container at a predetermined flow rate, or without introduction. Carrying it out without introducing the carrier gas is preferable in that there is less solid material loss.

With the present invention, the carrier gas is introduced into the solid material container at a predetermined flow rate during the impurity removal step, the heated impurities thereby being gasified and removed from the solid material container accompanied by the carrier gas. There is no need to discharge the impurities from the solid material container during the sintering step, so it is also possible not to introduce the carrier gas.

Invention 5

In the preprocessing method according to the present invention the solid material container has a carrier gas introduction pipe which introduces the carrier gas into the solid material container, a first filling unit which is disposed inside the solid material container and is filled with the solid material, a second filling unit which is disposed on at least part of an outer circumference of the first filling unit and is filled with the solid material, at least one tray-shaped third filling unit which is disposed on a ceiling-side of the interior of the solid material container, a solid material discharge pipe which discharges the carrier gas with the accompanying solid material from the solid material container, and heating unit which heats the solid material container, a carrier gas outlet of the carrier gas introduction pipe is provided to the first filling unit, an inlet of the solid material discharge pipe is provided to the third filling unit, and the carrier gas passes through the first filling unit, the second filling unit, and the third filling unit, in this order.

With the present invention, a carrier gas having a low solid material vapour concentration is first supplied to the first filling unit (which has a relatively low temperature since the heating unit is disposed outside the container) which is disposed in the middle of the solid material container and then supplied to the second filling unit (which has a relatively high temperature) which is disposed on a side wall of the solid material container. It is then introduced into the tray-shaped third filling unit and discharged out of the container.

With the present invention, the carrier gas passes through the first filling unit, the second filling unit, and the third filling unit, in this order, and is introduced from the solid material container. Therefore, the solid material, the impurities included in the solid material, and the carrier gas thoroughly come into contact with each other, and the gas including the impurities can be discharged from the solid material container.

If the solid material container is heated and the solid material is discharged, once discharge of the solid material begins, the solid material temperature of parts of the solid material which have gasified (sublimated) falls, even if the temperature inside the solid material container prior to discharging the solid material from the solid material container was uniform, by coming into contact with the solid material.

If the solid material is heated from the outside, the temperature of the second filling unit, which is disposed further out than the first filling unit, tends to be higher during discharge of the solid material. Therefore, the solid material which has become vapour in the first filling unit and is accompanied by the carrier gas is introduced into the third filling unit without causing condensation in the second filling unit. By reducing condensation of the solid material, blockage of the gas flow path is minimized, which can prevent increases in pressure loss caused by blockage of the gas flow path or a drop in discharged impurity content. The third filling unit can be a single tray-shaped filling unit, or a plurality of tray-shaped filling units stacked vertically.

Invention 6

In the preprocessing method according to the present invention, the solid material may include at least one compound selected from the group consisting of $WCl_5$, $WCl_6$, $WOCl_4$, $WO_2Cl_2$, $SiI_4$, $TiI_4$, $GeI_4$, $GeI_2$, $TiBr_4$, $Si_2I_6$, $BI_3$, $PI_3$, $TiF_4$, $TaF_5$, $MOO_2Cl_2$, $MOOCl_4$, $ZrCl_4$, $NbCl_5$, $NbOCl_3$, $TaCl_5$, $VCl_5$, $Y(CH_3C_5H_4)_3$, $Sc(CH_3C_5H_4)_3$, $MoCl_5$, $AlCl_3$, $HfCl_4$, $(CH_3)_3In$, $(C_5H_5)_2Mg$, $NbF_5$, $XeF_2$, $VF_5$ or carboxylic acid anhydride.

For example, the phase transition points from the low-temperature phase to the high-temperature phase for $WCl_6$ and $WCl_5$ are 176° C. and 180° C., respectively. In this case, carrying out crystallization and impurity removal while heating the solid material at a temperature below its phase transition point allows removal of impurities while maintaining the crystal state of the $WCl_6$ or $WCl_5$, which is the solid material, in the low-temperature phase.

For example, $TiI_4$ has a phase transition point from the low-temperature phase to the high-temperature phase at 106° C. In this case, carrying out crystallization and impurity removal while heating the solid material at a temperature below its phase transition point allows removal of impurities while maintaining the crystal state of the $TiI_4$, which is the solid material, in the low-temperature phase.

Thus, with the preprocessing method according to the present invention, a solid material with reduced impurities and a stable vapour pressure can be supplied. Furthermore, it is possible to connect the solid material container filled during the preprocessing directly to a semiconductor device and use it directly in the semiconductor deposition step without filling the solid material in which impurities have been removed and the vapour pressure has been stabilized. Hence, it is possible to avoid the hassle of the transfer process after the preprocessing step and prevent contamination of the solid material caused by the transfer process.

Invention 7

One aspect of a solid material product according to the present invention is a solid material product in which the solid material to which the preprocessing method according to any one of inventions 1 to 5 is filled in a solid material container.

With the solid material product of the present invention, a solid material product can be provided which can be used in a semiconductor layer deposition step, etc., without having to transfer the solid material to which the preprocessing method has been applied into a separate solid material container.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

Figure 1:
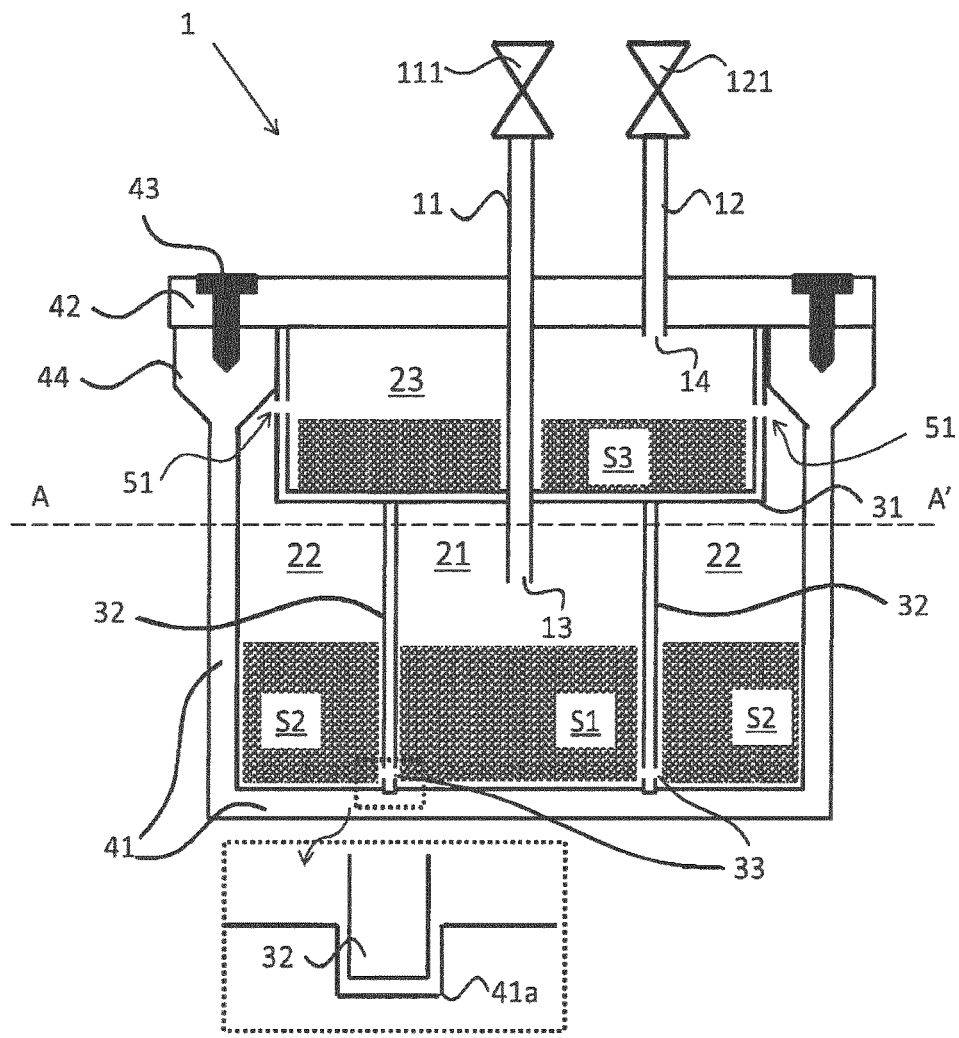
FIG. 1 is a view showing an example of a configuration of a solid material container.

Several embodiments of the present invention are described below. The embodiments described below describe one example of the present invention. The present invention is not limited in any way to the following embodiments, and includes variations implemented without departing from the scope of the present invention. Note that all the configurations described below are not necessarily essential configurations of the present invention.

Embodiment 1—Impurity Removal Step and Sintering Step

A method for preprocessing a solid material according to the present invention comprises an impurity removal step of heating a solid material which fills a solid material container at a temperature lower than the melting point of the solid material, and removing at least part of the impurities contained in the solid material.

The preprocessing method according to the present invention can further comprise a sintering step of heating the solid material which fills a solid material container at a temperature less than a phase transition point of the solid material, and sintering at least part or all of the solid material.

The solid material may be a precursor used in depositing a semiconductor layer. The solid material may be the precursor itself, or the solid material carried on a carrier body such as beads, etc. The solid material may be in a solid state when being filled into a container, it may be a solid material when the solid material container is being transported, and it may be in a liquid state when being filled or when being heated after being filled. There is no particular limitation on the solid material, which may be a material including a compound selected from the group consisting of an organic compound, an organic metal compound, a metal halide, and mixtures of these.

Table 1 gives the melting points and phase transition points for the main solid materials.

The heating temperature in the impurity removal step need only be a temperature lower than the melting point of the solid material, e.g., any temperature in the range 25° C. to 283° C., inclusive, for $WCl_6$, which has a melting point of 284° C., or any temperature in the range 25° C. to 249° C., inclusive, for tungsten pentachloride (henceforth $WCl_5$), which has a melting point of 250° C.

Similarly, the temperature for other solid materials need only be at least 25° C. and within a range no greater than the melting point of the solid material. The upper limit of the heating temperature may be, for example, a temperature 1° C. lower than the melting points given in Table 1 for the solid materials given in Table 1.

TABLE 1

| Compound | Melting point (° C.) | Phase transition point (° C.) |
| --- | --- | --- |
| $ZrCl_4$ | 437 | — |
| $Y(CH_3C_5H_4)_3$ | 124 | — |
| $XeF_2$ | 129 | — |
| $WOCl_4$ | 211 | — |
| $WO_2Cl_2$ | 265 | — |
| $WCl_6$ | 284 | 176 |
| $WCl_5$ | 250 | 180 |
| $VF_5$ | 20 | — |
| $VCl_5$ | 260 | — |
| $TiI_4$ | 150 | 106 |
| $TiF_4$ | 344 | — |
| $TiBr_4$ | 39 | — |
| $TaF_5$ | 97 | — |
| $TaCl_5$ | 216 | — |
| $SiI_4$ | 120 | — |
| $Si_2I_6$ | 200(decompose) | — |
| $Sc(CH_3C_5H_4)_3$ | 104 | — |
| $PI_3$ | 61 | — |
| $NbF_5$ | 77 | — |
| $NbCl_5$ | 205 | — |
| $MoOCl_4$ | 100 | — |
| $MoO_2Cl_2$ | 184(Subl) | — |
| $MoCl_5$ | 194 | — |
| $HfCl_4$ | 432 | — |
| $GeI_4$ | 146 | — |
| $GeI_2$ | 460 | — |
| $BI_3$ | 44 | — |
| $AlCl_3$ | 192 | — |
| $(CH_3)_3In$ | 88 | — |
| $(C_5H_5)_2Mg$ | 176 | — |

The heating time in the impurity removal step depends on the size of the solid material container, the volume of the solid material container, and the weight of the solid material when filling the solid material container. The heating time may be 2 to 12 hours, inclusive, when the solid material container is, for example, round and has a diameter of 0.3 m to 1.0 m and a height of 0.3 to 1.0 m, and the filling weight of the solid material is 1 kg to 20 kg.

The heating time during the impurity removal step may be determined on the basis of the target weight of the solid material in the solid material container. For example, the heating time in the impurity removal step may be the amount of time until the weight of the solid material in the solid material container falls by 10% compared to when the impurity removal step started.

The impurity removal step may further include the sintering step. The sintering step can be carried out after the impurity removal step is carried out, or concurrently with the impurity removal step.

The heating time in the sintering step depends on the size of the solid material container, the volume of the solid material container, and the weight of the solid material when filling the solid material container. The heating time may be 8 to 24 hours, inclusive, when the solid material container is, for example, round and has a diameter of 0.3 m to 1.0 m and a height of 0.3 to 1.0 m, and the filling weight of the solid material is 1 kg to 20 kg.

The heating temperature during the impurity removal step and the sintering step is more preferably a temperature lower than the phase transition point of the solid material. If it is a temperature less than the phase transition point, the phase transition speed is faster the higher the temperature, which is even more preferable. For example, in the case of $WCl_6$, which has a phase transition point of 176° C., the temperature range of 126° C. to 175° C., inclusive, is preferable, and from 166° C. to 175°, inclusive, is more preferable. In the case of $WCl_5$ which has a phase transition point of 180° C., the temperature range of 130° C. to 179° C., inclusive, is preferable, and from 170° C. to 179°, inclusive, is more preferable.

In the case of $TiI_4$ which has a phase transition point of 106° C., the temperature range of 56° C. to 105° C., inclusive, is preferable, and from 96° C. to 105°, inclusive, is more preferable.

The solid material container is not particularly limited to the container filled with the solid material, and may be a metal container made out of aluminium, etc., or a specific metal container made out of glass, etc. It is possible for the solid material container to have a carrier gas inlet and inlet valve, a discharge outlet and discharge valve for discharging the carrier gas and the solid material vapour accompanying the carrier gas, and a charging port and charging valve for filling the solid material and a maintenance valve as needed. The interior of the solid material container may be an integrated container with one space, or it may be divided into two or more spaces by trays or gate valves, etc.

The interior of the solid material container may be depressurized before carrying out the impurity removal step. The pressure inside the solid material container during depressurization is not limited to any particular pressure as long as it does not go beyond the withstand pressure of the solid material container during heating, and can be set to, for example, any pressure between 10 Torr and atmospheric pressure.

The impurity removal step may be from one hour to 50 hours long, depending on the state of the solid material, the volume of the solid material container, and the filled amount of the solid material, etc. The heating temperature is less than the melting point of the solid material. The heating temperature is less than the melting temperature of the solid material and may be a temperature at or below the phase transition point.

The sintering step may be from 0.5 hours to 50 hours long, depending on the state of the solid material, the volume of the solid material container, the state and content of the impurities included in the solid material, and the filled amount of the solid material, etc. The heating temperature is less than the melting point of the solid material. The heating temperature is less than the melting temperature of the solid material and may be a temperature at or below the phase transition point.

Separate Embodiment 1

As another embodiment, it is also possible to introduce the carrier gas when initiating the heating, without carrying out the sintering step of heating a solid material container 1 without introducing the carrier gas. The temperature of the solid material container 1 may be 170° C., as in Embodiment 1, the carrier gas flow rate may be 10 SCCM, and the heating time may be 20 hours.

Separate Embodiment 2

As yet another embodiment, it is also possible for the temperature of the solid material container 1 to be 160° C., the carrier gas flow rate to be 10 SCCM, and the heating time to be 50 hours in the preprocessing method as in Embodiment 1.

Separate Embodiment 3

As yet another embodiment, it is also possible to carry out an impurity removal step in which the temperature of the solid material container 1 is 170° C., the carrier gas flow rate is 10 SCCM, and the heating time is 2 hours in the preprocessing method as in Embodiment 1, and then stop introduction of the carrier gas, and carry out the sintering step, with the temperature of the solid material container 1 maintained at 170° C. for 12 hours.

The carrier gas is not limited to any particular gas, and may be nitrogen, argon, helium, dry air, or hydrogen, or a combination thereof. An inert gas which does not cause a chemical reaction with the solid material is selected.

Separate Embodiment 1—Container Structure

The solid material container 1 according to Embodiment 1 is described below, with reference to FIG. 1. The solid material container 1 is a solid material container for gasifying and supplying solid materials S1, S2, and S3, having a carrier gas introduction pipe 11 which introduces the carrier gas into the solid material container 1, a first filling unit 21 which is disposed inside the solid material container 1 and is filled with the solid material S1, a second filling unit 22 which located on at least part of the outer circumference of the first filling unit 21 and is filled with the solid material S2, at least one tray-shaped third filling unit 23 which is disposed on the ceiling side of the interior of the solid material container 1, and a solid material discharge pipe 12 which discharges the solid materials S1, S2, and S3 accompanying the carrier gas out of the solid material container.

A carrier gas outlet port 13 in the carrier gas introduction pipe 11 is provided to the first filling unit 21. An inlet port 14 of the solid material discharge pipe 12 is provided to the third filling unit 23.

The solid material container is configured such that the carrier gas passes through the first filling unit 21, the second filling unit 22, and the third filling unit 23 in this order. Details are described below.

The solid material container 1 is completely made out of stainless steel and is configured by securing a stainless steel lid 42 to a stainless steel round cylindrical container 41 which is closed at one end with screw fittings 43. A top edge 44 of the round cylindrical container 41 is thicker than parts other than the top edge, because the screw fittings 43 are inserted thereinto and in order to secure the bottom of the round cylindrical solid material container 41 and the lid 42, which are heavy, together with sufficient strength. Besides the carrier gas introduction pipe 11 and the solid material discharge pipe 12, the lid 42 is provided with a maintenance port (not shown in the drawings) and a pressure gauge port (not shown in the drawings). The carrier gas introduction pipe 11 is provided with a container inlet valve 111, and the solid material discharge pipe is provided with a container outlet valve 121.

The tray 31 which forms the third filling unit 23 is a flat, round tray made out of stainless steel, and is designed such that the outer circumference of the tray is in contact with the inside of the top edge 44. The places where the top edge 44 comes in contact with the tray 31 transfers heat to the third filling unit 23 when the solid material container 1 is heated from the outside. The side walls of the tray 31 are in circular contact with the lid 42. Gas is thus prevented from flowing directly into the solid material discharge pipe 12 from the second filling unit 22.

Dividers 32 which divide the first filling unit 21 and the second filling unit 22 are cylindrical stainless steel plates. Circular grooves 41*a* having the a radius equal to the diameter of the cylinders of the dividers 32 are formed in the bottom face of the round cylindrical container 41, and bottom edges of the dividers 32 fit into the grooves 41*a*.

The tray 31 is disposed on the top edges of the dividers 32. Eight 2-mm-diameter holes (corresponding to carrier gas through-section 33) are formed horizontally at equal distances in the bottom of the dividers 32 (at a height of 5 mm from the bottom face of the solid material container).

The carrier gas introduction pipe 11 passes through the middle of the tray 31 forming the third filling unit 23, and the carrier gas outlet 13 opens into the first filling unit 21. The carrier gas is introduced into the first filling unit 21 from the carrier gas introduction pipe 11 and comes in contact with the solid material S1 filling the first filling unit 21. A through-section (not shown in the drawings) is provided to the tray 31. The carrier gas introduction pipe 11 passes through the through-section in the tray 31. The through-section in the tray 31 is secured to the part of the carrier gas introduction pipe 11 which passes therethrough by means of packing. The packing not only prevents solid material from falling form the third filling unit 23 into the first filling unit 21, but also prevents the gas in the first filling unit 21 from flowing directly into the third filling unit 23 without passing through the second filling unit 22.

The solid material S1 in the first filling unit 21 is gasified (or sublimated) and flows into the second filling unit 22 through a carrier gas through-section 33 accompanied by the carrier gas. The carrier gas and solid material vapour flowing into the second filling unit 22 come in contact with the solid material S2 filling the second filling unit 22. The second filling unit 22 has a pressure around 1 Torr lower than the first filling unit 21, and the surface of the solid material S1 filling the first filling unit 21 is about 1° C. hotter than the surface of the solid material S2 filling the second filling unit 22. Therefore, the solid material S2 which fills the second filling unit 22 is gasified (sublimated) and flows into the third filling unit 23 via openings 51 (see FIG. 4) in a side wall in the tray 31, accompanied by the carrier gas. The openings 51 are provided in the tray side wall below where it comes in contact with the bottom of the round cylindrical container 41. The openings 51 are 16 2-mm-diameter holes arranged horizontally equidistant along the side face of the tray 31. The pressure in third filling unit 23 is around 1 Torr lower than in the second filling unit 22. Therefore, the solid material S3 filling the third filling unit 23 is gasified and discharged out of the solid material container 1 via the solid material discharge pipe 12, accompanied by the carrier gas.

The carrier gas introduction pipe 11 passes through the middle of the tray 31 forming the third filling unit 23, and the carrier gas outlet 13 opens into the first filling unit 21. The carrier gas is introduced into the first filling unit 21 from the carrier gas introduction pipe 11 and comes in contact with the solid material S1 filling the first filling unit 21. A through-section (not shown in the drawings) is provided to the tray 31. The carrier gas introduction pipe 11 passes through the through-section in the tray 31. The through-section in the tray 31 is secured to the part of the carrier gas introduction pipe 11 which passes therethrough by means of packing. The packing not only prevents solid material from falling form the third filling unit 23 into the first filling unit 21 but also prevents the gas in the first filling unit 21 from flowing directly into the third filling unit 23 without passing through the second filling unit 22.

The solid material S1 in the first filling unit 21 is gasified (or sublimated) and flows into the second filling unit 22 through a carrier gas through-section 33 accompanied by the carrier gas. The carrier gas and solid material vapour flowing into the second filling unit 22 come in contact with the solid material S2 filling the second filling unit 22. The second filling unit 22 has a pressure around 1 Torr lower than the first filling unit 21, and the surface of the solid material S1 filling the first filling unit 21 is about 1° C. hotter than the surface of the solid material S2 filling the second filling unit 22. Therefore, the solid material S2 which fills the second filling unit 22 is gasified (sublimated) and flows into the third filling unit 23 via an opening 51 (see FIG. 4) in a side wall in the tray 31, accompanied by the carrier gas. The opening 51 is provided in the tray side wall below where it comes in contact with the bottom of the round cylindrical container 41. The openings 51 are 16 2-mm-diameter holes arranged horizontally equidistant along the side face of the tray 31. The pressure in third filling unit 23 is around 1 Torr lower than in the second filling unit 22. Therefore, the solid material S3 filling the third filling unit 23 is gasified and discharged out of the solid material container 1 via the solid material discharge pipe 12, accompanied by the carrier gas.

There is no particular limitation on the heating unit (not shown in the drawings) which heats the solid material container, as long as it can heat the solid material container. It can be a constant-temperature tank which contains all the solid material containers, a mantle heater, or a block heater.

Separate Embodiment 3

One example of an embodiment according to the present invention is a solid material product, in which the solid material container 1 is filled with the solid material $WCl_6$ which has been preprocessed as shown in Embodiment 1. The solid material product is disposed in a semiconductor device which deposits a semiconductor layer, and the solid material vapour is supplied to the semiconductor device from the solid material container 1. By making the temperature at which the semiconductor layer is deposited around the same as the heating temperature of the preprocessing in Embodiment 1, the semiconductor layer can be deposited while maintaining the crystal state formed during the preprocessing (i.e., while maintaining a fixed vapour pressure). Accordingly, it is possible to deposit a uniform semiconductor layer with a stable amount of the solid material supplied to the semiconductor device.

Separate Embodiment 4

As another embodiment, a semiconductor product can be configured by transferring the solid material to which the preprocessing method as shown in Embodiment 1 from the solid material container 1 used in the preprocessing method into a separate solid material container.

Embodiment 1—Filling the Solid Material

The round cylindrical container 41, the lid 42, the dividers 32, and the tray 31, which have been washed and dried, are placed together with the solid material into a glove box having an inert atmosphere. The dividers 32 are fitted into the round grooves 41a which are on the bottom surface of the round cylindrical container 41 and fixed in place. Of the total quantity of the $WCl_6$ filling the solid material container 1, part is put in the first filling unit (e.g., around 10% to 70% of the total quantity), and another part is put into the second filling unit (e.g., 10% to 50% of the total quantity). Next, the tray 31 is placed on the dividers 32 and filled with the remaining solid material. Thereafter, the lid 42 is placed on the round cylindrical container 41 and affixed by the screw fittings 43. Packing maintaining a seal is inserted between the round cylindrical container 41 and the lid 42. Filling the solid material container 1 with the solid material is thus complete.

Embodiment 1

The preprocessing method according to Embodiment 1 was carried out using the solid material container shown in FIG. 1.
Filling of Solid Material $WCl_6$ The round cylindrical container 41, the lid 42, the dividers 32, and the tray 31, which have been washed and dried, were placed together with the $WCl_6$, which is the solid material, into a glove box having an inert atmosphere. The dividers 32 were fitted into the round grooves 41a which are on the bottom surface of the round cylindrical container 41 and fixed in place. Of the total quantity (6.5 kg) of the $WCl_6$ filling the solid material container 1, 2.6 kg was put in the first filling unit and another 2.6 kg was put in the second filling unit. Next, the tray 31 was placed on the dividers 32 and filled with the remaining 1.3 kg of the $WCl_6$. Thereafter, the lid 42 was placed on the round cylindrical container 41 and affixed by the screw fittings 43. Packing maintaining a seal was inserted between the round cylindrical container 41 and the lid 42. Filling the solid material container 1 with the solid material is thus complete.
Preprocessing of the Solid Material The solid material container 1, filled with the solid material (the $WCl_6$ in the present embodiment) was depressurized using a vacuum pump.

The pressure inside the solid material container 1 during depressurizing was 100 Torr. Specifically, the container inlet valve 111 was closed, the vacuum pump was connected behind the container outlet valve 121, and the container outlet valve 121 was opened for depressurization.

Next, heating was applied with a mantle heater (not shown in the drawings) disposed outside the solid material container 1 until the temperature of the solid material container 1 reached 170° C. Because the phase transition point of the $WCl_6$ is 176° C., the $WCl_6$ constitutes a low-temperature phase in the present embodiment which was heated to 170° C.

After the pressure inside the solid material container 1 reached 100 Torr, the container outlet valve 121 was closed. Next, the carrier gas (nitrogen gas in the present embodiment) was introduced by opening the container inlet valve 111 and the container outlet valve 121 (impurity removal step). The flow rate of the carrier gas was set at 1000 SCCM. The flow time of the carrier gas was 2 hours, and the temperature of the solid material container 1 was maintained at 170° C.

Next, introduction of the carrier gas (nitrogen gas in the present embodiment) was stopped by closing the container inlet valve 111 and the container outlet valve 121 (sintering step). The temperature of the solid material container 1 was maintained at 170° C. for 12 hours.

Figure 2:
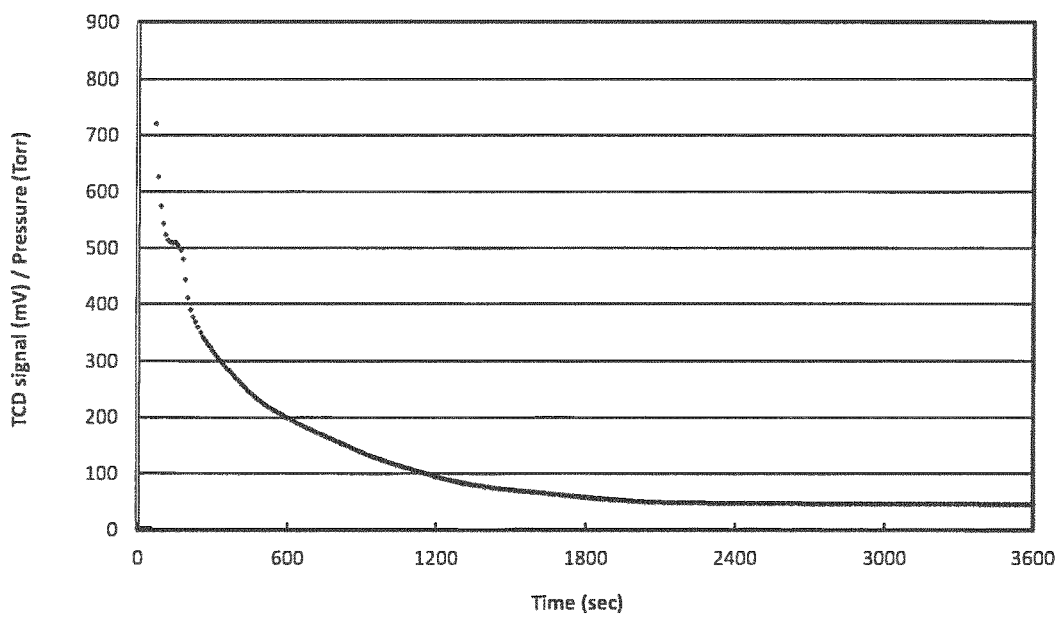
FIG. 2 is a view showing the results of the TCD measurement of the gas discharged from the solid material container.

FIG. 2 shows the results of an analysis carried out using a Shimadzu TCD sensor on the gas discharged from the solid material container 1 with the carrier gas in the impurity removal step. The output value of the TCD sensor was large immediately after the start of the impurity removal step but gradually fell thereafter, and substantially stabilized at around 0.5 hours after the start of the impurity removal step. These result show that the impurities, such as $WOCl_4$, which have a higher vapour pressure than the $WCl_6$, were discharged from the solid material container 1. $WOCl_4$ is an impurity which is mainly produced by oxidation of the $WCl_6$, and is formed so as to cover the surface of the granulate solid material, thereby minimizing self-diffusion of the $WCl_6$ inside the solid material. It is thought that the crystal state of the $WCl_6$ is made uniform by the $WOCl_4$, which is the impurity formed on the solid surfaces, being removed and the self-diffusion of the granulate $WCl_6$ being minimized. It is thought that the TCD sensor output value stabilized by removing the $WOCl_4$, after which there is no longer a need for the impurity to be accompanied by the carrier gas, so the carrier gas supply can be stopped.

Table 2 gives the results of the analysis of the metal impurities included in the $WCl_6$ after carrying out the preprocessing method according to Embodiment 1. Because the Mo and Zn content of the metal impurities was reduced, we were able to confirm that the metal impurities were removed by the preprocessing method according to Embodiment 1.

TABLE 2

| Metal element | Prior to preprocessing (wt. ppm) | After preprocessing (wt. ppm) | Lower detection value (wt. ppm) |
|---|---|---|---|
| Li | <0.5 | <0.5 | 0.5 |
| B | <10 | <10 | 10 |
| Ba | <0.5 | <0.5 | 0.5 |
| Co | <0.5 | <0.5 | 0.5 |
| Cr | <5 | <5 | 5 |
| Ga | <0.5 | <0.5 | 0.5 |
| Mo | 1.5 | <0.5 | 0.5 |
| Mg | <1 | <1 | 1 |
| Mn | <3 | <3 | 3 |
| Zn | 1.1 | 0.7 | 0.5 |

Vapour Pressure Measurement of the Solid Material

Figure 3:
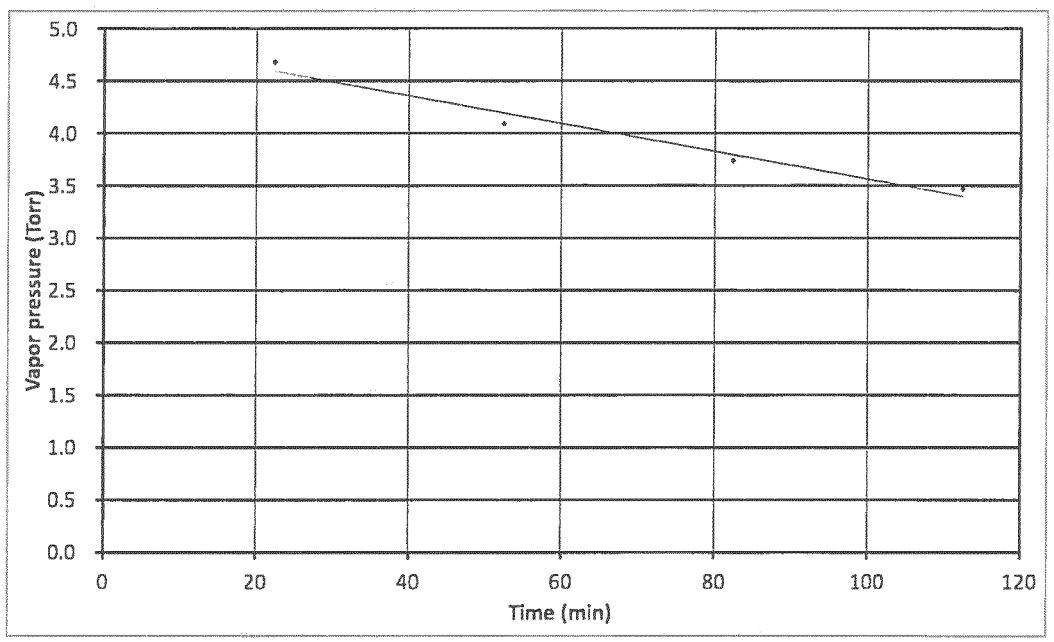
FIG. 3 is a view showing change over time in the vapour pressure of the solid material.

FIG. 3 gives the results of measuring the vapour pressure of the $WCl_6$ prior to the preprocessing used in Embodiment 1, using a thermogravimetric analyzer (Mettler Toledo TGA/DSC 3+) at 170° C. The vapour pressure of the $WCl_6$ tended to drop gradually from 4.6 Torr to 3.4 Torr over time.

On the other hand, when the vapour pressure was measured using the thermogravimetric analyzer at 170° C. for the $WCl_6$ after the preprocessing in Embodiment 1, the vapour pressure stabilized at 3.3 Torr. These results appear to indicate that the preprocessing according to the present embodiment resulted in formation of a uniform crystal state for the $WCl_6$ and stabilization of the vapour pressure.

Crystal State Analysis of the Solid Material

XRD (SmartLab by Rigaku) was used to analyze the crystal structure of the $WCl_6$ prior to the preprocessing according to Embodiment 1. The sample (un-preprocessed $WCl_6$) was mixed with fluid paraffin and pulverized with an agate mortar. The pulverized sample was placed on a sample plate and measured using a Cu Kα beam in the range 5-80°.

Figure 5:
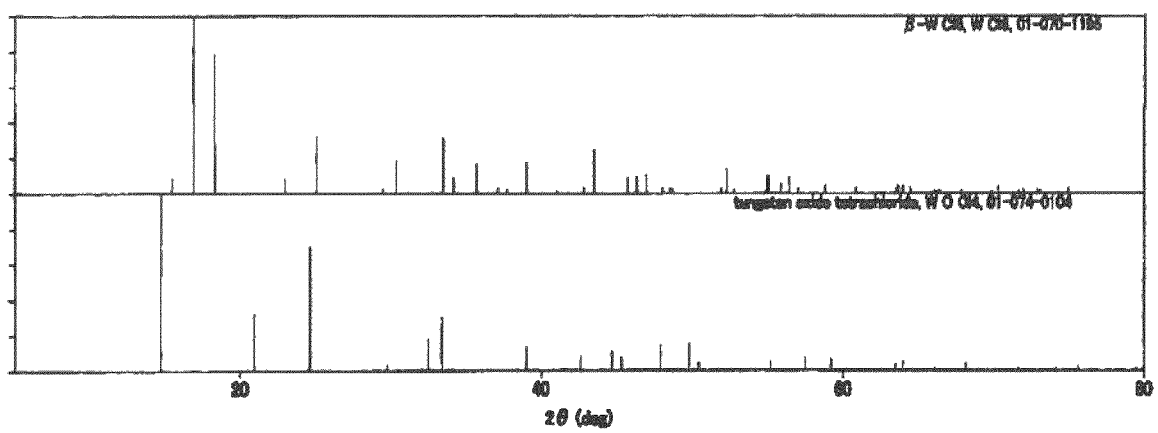
FIG. 5 is a view showing a standard sample measurement results using an XRD device.

The XRD device has a built-in standard sample measurement value for the crystal states of the low-temperature phases and high-temperature phases of $WCl_6$ (see FIG. 5), and the content ratio of the low-temperature phase and high-temperature phase in the sample being measured is calculated on the basis of that data. The top half of FIG. 5 gives the low-temperature-phase standard sample measurement results, and the bottom half of FIG. 5 gives the high-temperature-phase standard sample measurement results.

As a result of using XRD to analyze the $WCl_6$ prior to preprocessing using this procedure, the high-temperature phase occupied 99.9% or more. As a result of using XRD to analyze the $WCl_6$ after preprocessing using the same procedure, the low-temperature phase occupied 98% or more.

Therefore, in the vapour pressure measurement at 170° C. shown in FIG. 2, it is thought that the $WOCl_4$ which is an oxide impurity gasified prior to the start of the measurement, and thereafter the crystal state of the $WCl_6$ changed gradually to the low-temperature phase over time, the vapour pressure dropping at the same time as well. On the other hand, the $WCl_6$ after preprocessing was in the low-temperature phase, and it is thought that the low-temperature phase state was maintained and the vapour pressure stabilized by maintaining the temperature at 170° C.

Embodiment 2

Figure 4:
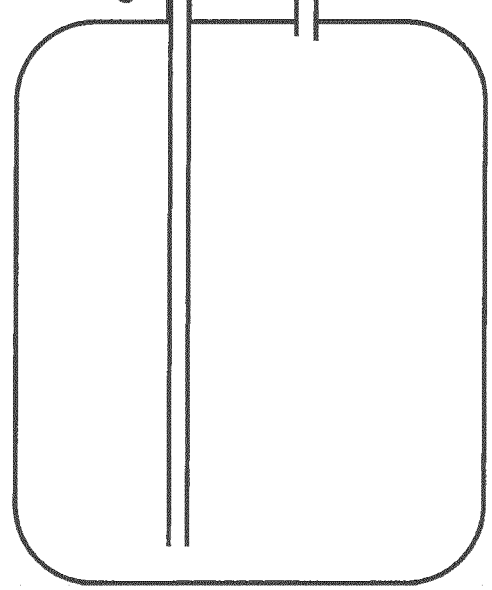
FIG. 4 is a view showing an example of a configuration of a solid material container.

A stainless steel solid material container 100 shown in FIG. 4 was filled with the solid material $WCl_5$. The solid material container 100 in FIG. 4 is an integral hollow container with no internal divisions, and has a dip tube type carrier gas introduction pipe 11 and solid material discharge pipe 12.

Without introducing the carrier gas, the pressure inside the solid material container 1 was made 150 Torr, and this was heated for 5 hours at 150° C., which is lower than the melting point of the $WCl_5$. The melting point of $WCl_5$ is around 250° C., and the phase transition point from the alpha type to the beta type is 180° C.

Table 3 gives the results of measuring the vapour pressure of the $WCl_5$ before and after the preprocessing shown in Embodiment 4, using a thermogravimetric analyzer (Mettler Toledo TGA/DSC 3+) at 150° C. The vapour pressure of the $WCl_5$ which had not been preprocessed tended to drop over time, but the $WCl_5$ which had been preprocessed, indicated in Embodiment 2, was confirmed to have very stable vapour pressure. It is thought that impurities with higher vapour pressure than the $WCl_5$ were removed by the preprocessing, and at the same time the crystal state of the $WCl_5$ mainly formed the alpha type which is the low-temperature phase.

TABLE 3

| Elapsed time (min) | $WCl_5$ vapour pressure prior to preprocessing (Torr) | $WCl_5$ vapour pressure after preprocessing (Torr) |
|---|---|---|
| 10 | 5 | 1.7 |
| 20 | 4.2 | 1.7 |
| 30 | 3.8 | 1.6 |
| 40 | 3.3 | 1.7 |
| 50 | 3 | 1.6 |
| 60 | 2.8 | 1.6 |
| 70 | 2.6 | 1.6 |
| 80 | 2.5 | 1.5 |
| 90 | 2.5 | 1.6 |
| 100 | 2.4 | 1.6 |
| 110 | 2.3 | 1.6 |
| 120 | 2.2 | 1.5 |

Table 4 gives the results of measuring the vapour pressure of the $WCl_5$ before and after the preprocessing shown in Embodiment 2, using a thermogravimetric analyzer (Mettler Toledo TGA/DSC 3+) at 115° C. The vapour pressure of the $WCl_5$ which had not been preprocessed tended to drop over time, but the $WCl_5$ which had been preprocessed, indicated in Embodiment 2, was confirmed to have very stable vapour pressure. It is thought that impurities with higher vapour pressure than the $WCl_5$ were removed by the preprocessing, and at the same time the crystal state of the $WCl_5$ mainly formed the alpha type which is the low-temperature phase.

TABLE 4

| Elapsed time (min) | $WCl_5$ vapour pressure prior to preprocessing (Torr) | $WCl_5$ vapour pressure after preprocessing (Torr) |
|---|---|---|
| 10 | 0.7 | 0.1 |
| 20 | 0.5 | 0.1 |
| 30 | 0.3 | 0.1 |
| 40 | 0.3 | 0.1 |
| 50 | 0.3 | 0.1 |
| 60 | 0.3 | 0.1 |
| 70 | 0.3 | 0.1 |
| 80 | 0.3 | 0.1 |
| 90 | 0.3 | 0.1 |
| 100 | 0.3 | 0.1 |
| 110 | 0.3 | 0.1 |
| 120 | 0.3 | 0.1 |

EXPLANATION OF THE REFERENCE NUMERALS

1 Solid material container
11 Carrier gas introduction pipe
12 Solid material discharge pipe
13 Carrier gas outlet
14 Solid material discharge pipe inlet
21 First filling unit
22 Second filling unit
23 Third filling unit
31 Tray
32 Dividers
33 Carrier gas through-section
S1 Solid material (in first filling unit)
S2 Solid material (in second filling unit)
S3 Solid material (in third filling unit)

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

The invention claimed is:

1. A method for preprocessing a solid material, the method comprising an impurity removal step of:
heating a solid material which fills a solid material container at a temperature lower than the melting point of the solid material,
removing at least part of the impurities contained in the solid material,
heating the solid material which fills a solid material container at a temperature less than a phase transition point of the solid material, and
sintering at least part or all of the solid material,
wherein in the impurity removal step, a carrier gas having a predetermined flow rate is introduced into the solid material container, and in the sintering step no carrier gas is introduced into the solid material container,
wherein the solid material container has a carrier gas introduction pipe which introduces the carrier gas into the solid material container, a first filling unit which is disposed inside the solid material container and is filled with the solid material, a second filling unit which is disposed on at least part of an outer circumference of the first filling unit and is filled with the solid material, at least one tray-shaped third filling unit which is disposed on a ceiling-side of the interior of the solid material container, a solid material discharge pipe which discharges the carrier gas with the accompanying solid material from the solid material container, and a heating unit which heats the solid material container, a carrier gas outlet of the carrier gas introduction pipe is provided to the first filling unit, an inlet of the solid material discharge pipe is provided to the third filling unit, and the carrier gas passes through the first filling unit, the second filling unit, and the third filling unit, in this order.

2. The method of claim 1, wherein the impurity removal step is a step of heating the solid material so as to reach a temperature less than a phase transition point thereof.

3. The method of claim 1, wherein the solid material includes a compound selected from the group consisting of $WCl_5$, $WCl_6$, $WOCl_4$, $WO_2Cl_2$, $SiI_4$, $TiI_4$, $GeI_4$, $GeI_2$, $TiBr_4$, $Si_2I_6$, $BI_3$, $PI_3$, $TiF_4$, $TaF_5$, $MoO_2Cl_2$, $MoOCl_4$, $ZrCl_4$, $NbCl_5$, $NbOCl_3$, $TaCl_5$, $VCl_5$, $Y(CH_3C_5H_4)_3$, $Sc(CH_3C_5H_4)_3$, $MoCl_5$, $AlCl_3$, $HfCl_4$, $(CH_3)_3In$, $(C_5H_5)_2Mg$, $NbF_5$, $XeF_2$, $VF_5$, and carboxylic acid anhydride.

4. The method of claim 3, wherein a solid material product is filled in the solid material container.

* * * * *